(12) United States Patent
Kutsukake (10) Patent No.: US 11,018,128 B2
(45) Date of Patent: May 25, 2021

(54) SEMICONDUCTOR DEVICE

(71) Applicant: TOSHIBA MEMORY CORPORATION, Minato-ku (JP)

(72) Inventor: Hiroyuki Kutsukake, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 291 days.

(21) Appl. No.: 16/127,926

(22) Filed: Sep. 11, 2018

(65) Prior Publication Data
US 2019/0229112 A1    Jul. 25, 2019

(30) Foreign Application Priority Data

Jan. 24, 2018  (JP) .............................. JP2018-010005

(51) Int. Cl.
*H01L 27/02* (2006.01)
*H01L 23/60* (2006.01)
*H01L 29/786* (2006.01)
*H01L 29/861* (2006.01)
*H01L 29/06* (2006.01)

(52) U.S. Cl.
CPC .......... *H01L 27/0266* (2013.01); *H01L 23/60* (2013.01); *H01L 27/0255* (2013.01); *H01L 27/0288* (2013.01); *H01L 29/78696* (2013.01); *H01L 29/8613* (2013.01); *H01L 29/0649* (2013.01)

(58) Field of Classification Search
CPC ............. H01L 27/0266; H01L 27/0255; H01L 27/0288; H01L 23/60
See application file for complete search history.

(56) References Cited

U.S. PATENT DOCUMENTS

| 6,545,321 B2 | 4/2003 | Morishita |
| 9,093,287 B2 | 7/2015 | Ko |
| 9,865,588 B2 | 1/2018 | Isobe |
| 2013/0026576 A1* | 1/2013 | Stockinger .......... H01L 27/0255 257/355 |

(Continued)

FOREIGN PATENT DOCUMENTS

| JP | 5-75185 | 10/1993 |
| JP | 2016-6862 | 1/2016 |

(Continued)

*Primary Examiner* — Scott Bauer
(74) *Attorney, Agent, or Firm* — Oblon, McClelland, Maier & Neustadt, L.L.P.

(57) ABSTRACT

A semiconductor device according to an embodiment includes a semiconductor substrate of a first conducting type. A pad is provided on the semiconductor substrate. An internal circuit is provided on the semiconductor substrate. An electrostatic discharge protection element is provided between the pad and the internal circuit. The electrostatic discharge protection element comprises a first well of a second conducting type, a second well of a first conducting type, and a first electrode layer of a second conducting type. The first well of a second conducting type is provided in a surface region of the semiconductor substrate. The second well of a first conducting type is provided inside the first well in the surface region of the semiconductor substrate. The first electrode layer of a second conducting type is provided inside the second well in the surface region of the semiconductor substrate.

16 Claims, 4 Drawing Sheets

(56) References Cited

U.S. PATENT DOCUMENTS

2015/0145058 A1\* 5/2015 Nandakumar ...... H01L 27/0928
257/371
2015/0348961 A1 12/2015 Isobe

FOREIGN PATENT DOCUMENTS

| TW | I286835 B | 9/2007 |
| TW | 201431094 A | 8/2014 |

\* cited by examiner

SEMICONDUCTOR DEVICE

CROSS REFERENCE TO RELATED APPLICATIONS

This application is based upon and claims the benefit of priority from the prior Japanese Patent Application No. 2018-010005, filed on Jan. 24, 2018, the entire contents of which are incorporated herein by reference.

FIELD

The embodiments of the present invention relate to a semiconductor device.

BACKGROUND

In a semiconductor device such as a semiconductor memory, a VLV (Very Low Voltage) transistor for a high-speed interface is used. The VLV transistor has a gate oxide film and a gate length or the like that are reduced more than those of an LV (Low Voltage) transistor, and differs largely in electric characteristics therefrom. Accordingly, it is necessary that an ESD (Electrostatic Discharge) protection element provided on the periphery of an I/O (Input/Output) pad is configured to be a circuit constituted of a diode of a relatively large scale and an RCTMOS (RC Triger Metal Oxide Semiconductor), so as to allow a larger discharge current to flow.

However, a diode having high current driving capability has a large layout area that leads to an increase in junction capacity (Cj). The increase in the junction capacity leads to leakage of a high-frequency signal, thereby degrading the function as a high-speed interface.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

The drawings are schematic or conceptual, and the ratios and the like among respective parts are not necessarily the same as those of actual products. In the present specification and the drawings, elements identical to those described in the foregoing drawings are denoted by like reference characters and detailed explanations thereof are omitted as appropriate.

A semiconductor device according to an embodiment includes a semiconductor substrate of a first conducting type. A pad is provided on the semiconductor substrate. An internal circuit is provided on the semiconductor substrate. An electrostatic discharge protection element is provided between the pad and the internal circuit. The electrostatic discharge protection element comprises a first well of a second conducting type, a second well of a first conducting type, and a first electrode layer of a second conducting type. The first well of a second conducting type is provided in a surface region of the semiconductor substrate. The second well of a first conducting type is provided inside the first well in the surface region of the semiconductor substrate. The first electrode layer of a second conducting type is provided inside the second well in the surface region of the semiconductor substrate.

First Embodiment

Figure 1:
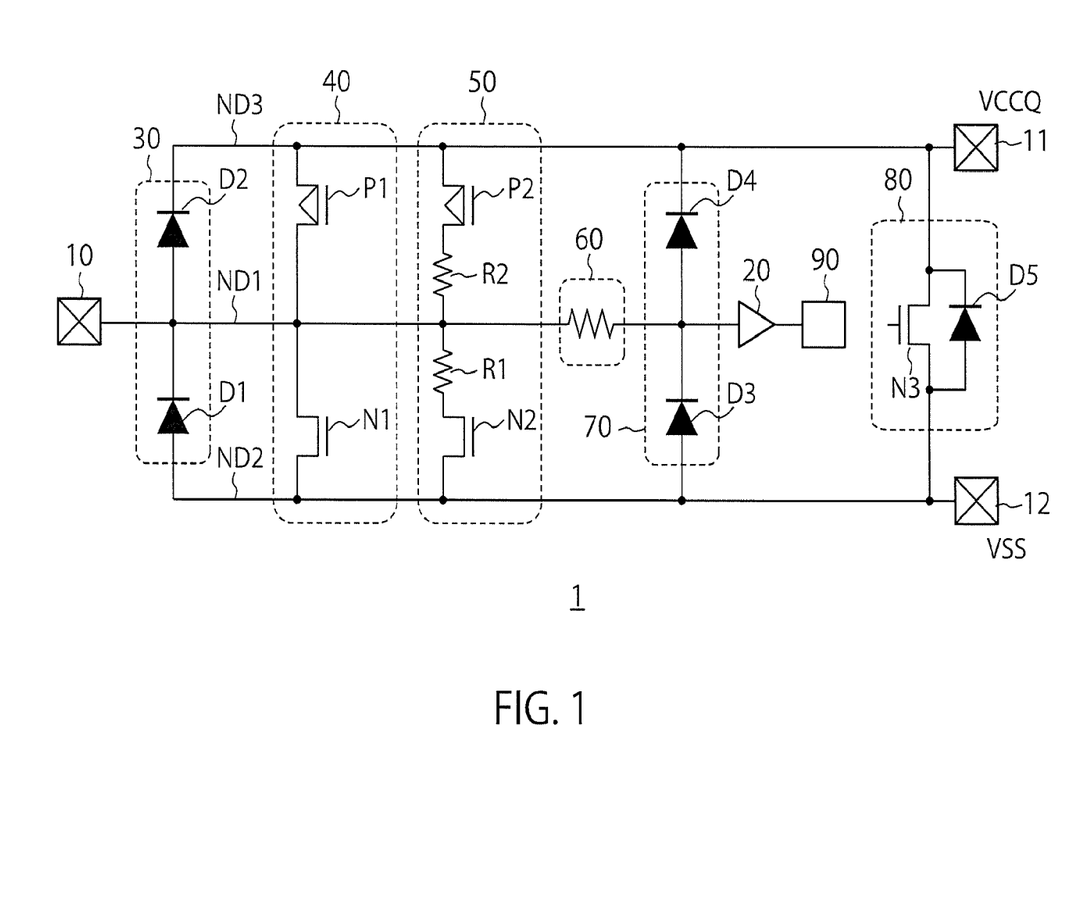
FIG. 1 is a circuit diagram illustrating a configuration example of an ESD protection circuit according to a first embodiment.

FIG. 1 is a circuit diagram illustrating a configuration example of an ESD protection circuit 1 according to a first embodiment. The ESD protection circuit 1 is connected to an I/O pad 10, power supply pads 11 and 12, and an input receiver 20. For example, the ESD protection circuit 1 is provided near the I/O pad 10 of a semiconductor device such as a semiconductor memory. The ESD protection circuit 1 is a circuit protecting an internal circuit 90 connected to the input receiver 20 against ESD, when the ESD occurs on the I/O pad 10 to be used to input or output data. The internal circuit 90 may be a circuit such as a memory cell array MCA or a peripheral circuit controlling the memory cell array MCA. The I/O pad 10 inputs data to the internal circuit 90, or outputs data from the internal circuit 90. The input receiver 20 is connected to the internal circuit 90, receives data from the I/O pad 10 and transfers this data to the internal circuit 90, or transfers data output from the internal circuit 90 to the I/O pad 10. The power supply pad 11 supplies a high-level power supply voltage VCCQ to the ESD protection circuit 1. For example, the high-level power supply voltage VCCQ is approximately 1.8 V to 3.0 V. The power supply pad 12 supplies a low-level power supply voltage VSS to the ESD protection circuit 1. For example, the low-level power supply voltage VSS is approximately 0 V.

The ESD protection circuit 1 includes a first ESD protection diode 30, an off-chip driver (OCD) 40, an on-die termination (ODT) 50, a protection resistor 60, a second ESD protection diode 70, and an ESD protection transistor 80.

The I/O pad 10 and the input receiver 20 are connected via a node ND1 and the protection resistor 60. A node ND2 is connected to the power supply pad 12, and a node ND3 is connected to the power supply pad 11.

The first ESD protection diode 30, the OCD 40, the ODT 50, the second ESD protection diode 70, and the ESD protection transistor 80 are connected in parallel between the node ND2 and the node ND3. Further, the first ESD protection diode 30, the OCD 40, the ODT 50, the second ESD protection diode 70, and the ESD protection transistor 80 are connected also to the node ND1.

The first ESD protection diode 30 as an electrostatic discharge protection element includes a first diode D1 and a second diode D2. An anode of the first diode D1 is connected to the node ND2, and a cathode of the first diode D1 is connected to the node ND1. An anode of the second diode D2 is connected to the node ND1, and a cathode of the second diode D2 is connected to the node ND3.

When a large negative voltage is applied as ESD to the I/O pad 10, the first diode D1 allows a current to flow (to be released) from the power supply pad 12 to the I/O pad 10. With this configuration, the ESD of a negative voltage is relaxed via the first diode D1, thereby protecting the internal circuit 90 connected to the input receiver 20. On the other hand, when a large positive voltage is applied as ESD to the I/O pad 10, the second diode D2 allows a current to flow (to be released) from the I/O pad 10 to the power supply pad 11. With this configuration, the ESD of a positive voltage is relaxed via the second diode D2, thereby protecting the internal circuit 90 connected to the input receiver 20.

The OCD 40 includes an N-MOS (Metal Oxide Semiconductor) transistor N1 and a P-MOS transistor P1. One end of the N-MOS transistor N1 is connected to the node ND2, and the other end thereof is connected to the node ND1. One end of the P-MOS transistor P1 is connected to the node ND1, and the other end thereof is connected to the node ND3. Gate electrodes of the N-MOS transistor N1 and the P-MOS transistor P1 are connected to an internal inverter circuit. With this configuration, the N-MOS transistor N1 and the P-MOS transistor P1 operate at a high speed in a mutually complementary manner. When the N-MOS transistor N1 is in a conducting state, the low-level power supply voltage VSS is applied to the node ND1. When the P-MOS transistor P1 is in a conducting state, the high-level power supply voltage VCCQ is applied to the node ND1. With a high-speed operation of the N-MOS transistor N1 and the P-MOS transistor P1 in a mutually complementary manner, the high-level power supply voltage (logic high) and the low-level power supply voltage (logic low) are transmitted as a digital signal to the node ND1. Because the high-level power supply voltage VCCQ (for example, 1.8 V to 3.0 V) is very small as compared to the ESD (for example, several thousand volts), the first ESD protection diode 30 does not become a conducting state by the high-level power supply voltage VCCQ.

The ODT 50 includes an N-MOS transistor N2, a P-MOS transistor P2, and resistors R1 and R2. One end of the N-MOS transistor N2 is connected to the node ND2, and the other end thereof is connected to the node ND1 via the resistor R1. One end of the P-MOS transistor P2 is connected to the node ND1 via the resistor R2, and the other end thereof is connected to the node ND3. Gate electrodes of the N-MOS transistor N2 and the P-MOS transistor P2 are connected to the internal inverter circuit. In the ODT 50, by inserting the resistor R1 and the resistor R2, an interference waveform from another chip is shaped in the I/O pad 10 by RC delay.

The protection resistor 60 is connected between the node ND1 and the input receiver 20. For example, the protection resistor 60 suppresses an increase in gate voltage of the internal circuit 90 by a surge current such as ESD.

The second ESD protection diode 70 includes a third diode D3 and a fourth diode D4. An anode of the third diode D3 is connected to the node ND2, and a cathode of the third diode D3 is connected to the node ND1. An anode of the fourth diode D4 is connected to the node ND1, and a cathode of the fourth diode D4 is connected to the node ND3. The second ESD protection diode 70 is provided to suppress an excessive voltage from being applied to the internal circuit 90 due to discharge by a CDM (Charged Device Model). Therefore, the third and fourth diodes D3 and D4 do not need large current driving capability, and the sizes thereof can be much smaller than those of the first and second diodes D1 and D2.

The ESD protection transistor 80 includes an N-MOS transistor N3 and a fifth diode D5. The N-MOS transistor N3 and the fifth diode D5 are connected in parallel to each other between the power supply pad 11 and the power supply pad 12. The ESD protection transistor 80 is in a non-conducting state in normal operation, and becomes a conducting state when ESD is applied, thereby allowing charges of the ESD to flow.

FIG. 2A to 2E are cross-sectional views illustrating a configuration example of a semiconductor memory according to the first embodiment. For example, the semiconductor memory according to the present embodiment is a NAND-type EEPROM (Electrically Erasable Programmable Read-Only Memory), and has a three-dimensional memory cell array MCA having a three-dimensional structure.

Figure 2A:
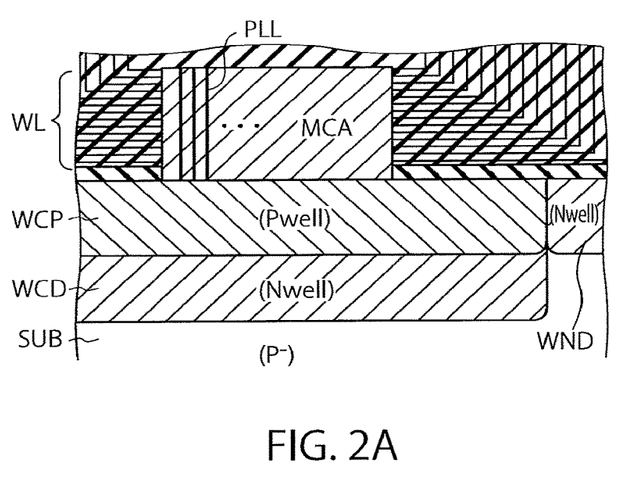
FIG. 2A to 2E are cross-sectional views illustrating a configuration example of a semiconductor memory according to the first embodiment.
Figure 2B:
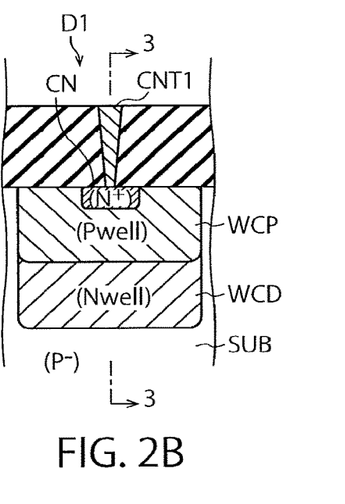
Figure 2C:
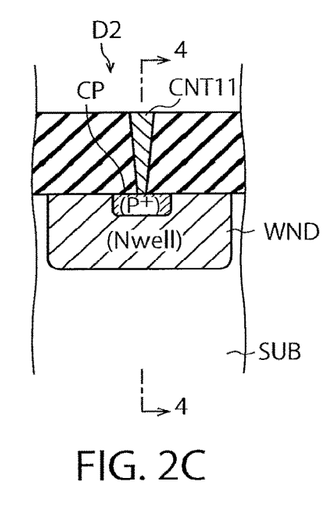
Figure 2D:
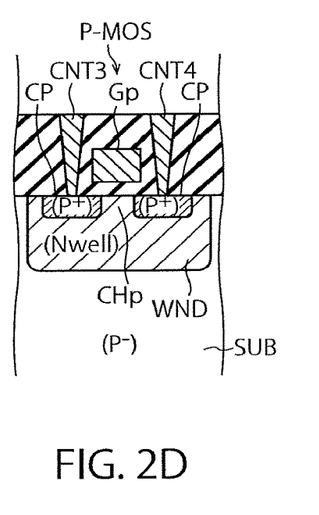
Figure 2E:
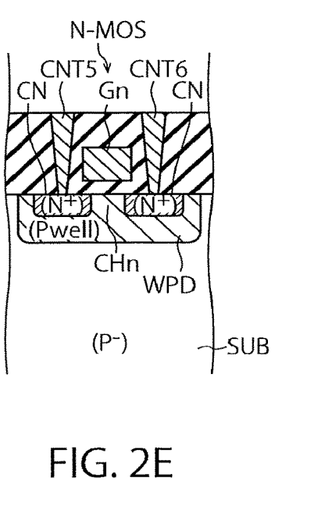

FIG. 2A illustrates a cross section of a region of the memory cell array MCA. FIG. 2B illustrates a cross section of the first diode D1 of the ESD protection circuit 1. FIG. 2C illustrates a cross section of the second diode D2 of the ESD protection circuit 1. FIG. 2D illustrates a cross section of a P-MOS transistor constituting a peripheral circuit. FIG. 2E illustrates a cross section of an N-MOS transistor of the peripheral circuit. Although FIG. 2D and FIG. 2E illustrate a single transistor, a large number of semiconductor elements such as transistors are provided in the peripheral circuit.

Elements such as the memory cell array MCA, the ESD protection circuit 1, and the peripheral circuit are provided on a surface region of a same semiconductor substrate SUB. For example, the semiconductor substrate SUB can be a P⁻-type silicon substrate.

The region of the memory cell array MCA illustrated in FIG. 2A has a P⁻-type semiconductor substrate (hereinafter, also simply "substrate") SUB, an N-well WCD, and a P-well WCP. When the substrate SUB is used as a P⁻ first well, the well structure below the memory cell array MCA is a triple-well structure. The N-well WCD is provided in the surface region of the substrate SUB. The P-well WCP is provided inside the N-well WCD in the surface region of the substrate SUB. An N-well WND is provided to be adjacent to the P-well WCP and the N-well WCD. The N-well WND is electrically connected to the N-well WCD, and is provided for determining a potential of the N-well WCD.

The memory cell array MCA is provided on the P-well WCP. The memory cell array MCA has semiconductor pillars PLL. Each semiconductor pillar PLL electrically connects a memory cell and a bit line (not illustrated), and functions as a channel part of the memory cell. For example, the semiconductor pillar PLL can be silicon filled in a memory hole (not illustrated). The semiconductor pillar PLL is electrically connected also to the P-well WCP, and transmits an erasing voltage to the memory cell via the P-well WCP when data of the memory cell is erased. For example, the P-well WCP applies approximately 20 V as the erasing voltage to the semiconductor pillar PLL when data is erased.

On the other hand, the substrate SUB is at approximately 0 V when data is erased. In order to apply an erasing voltage sufficiently to the P-well WCP, the N-well WCD is provided between the P-well WCP and the substrate SUB. When data is erased, an erasing voltage is applied also to the N-well WCD, but the erasing voltage is applied as a reverse bias at a PN junction between the N-well WCD and the substrate SUB. Accordingly, almost no current flows between the N-well WCD and the substrate SUB. Therefore, by making the well structure below the memory cell array MCA as a triple-well structure, the P-well WCP can apply an erasing voltage that is sufficiently high to the semiconductor pillar PLL when data is erased.

On the periphery of the semiconductor pillar PLL, a tunnel insulating film, a charge accumulation layer, and the like (not illustrated) that constitute a memory cell are provided. Furthermore, on the periphery thereof, layers of a plurality of word lines WL are provided. Because the configuration of the memory cell is not directly relevant to the present embodiment, detailed explanations thereof are omitted.

The first diode D1 illustrated in FIG. 2B includes an N-well WCD, a P-well WCP, an $N^+$-type electrode layer CN, and a contact plug CNT1. The first diode D1 has a triple-well structure similarly to below the memory cell array MCA. That is, configurations of the N-well WCD and the P-well WCP can be identical to configurations of those located below the memory cell array MCA. The electrode layer CN as a first electrode layer is provided inside the P-well WCP in the surface region of the substrate SUB. The electrode layer CN is constituted of a high-concentration N-type diffusion layer so as to electrically connect to the contact plug CNT1 with low resistance. The contact plug CNT1 is electrically connected to the electrode layer CN. The electrode layer CN and the P-well WCP constitute the first diode D1.

Figure 3:
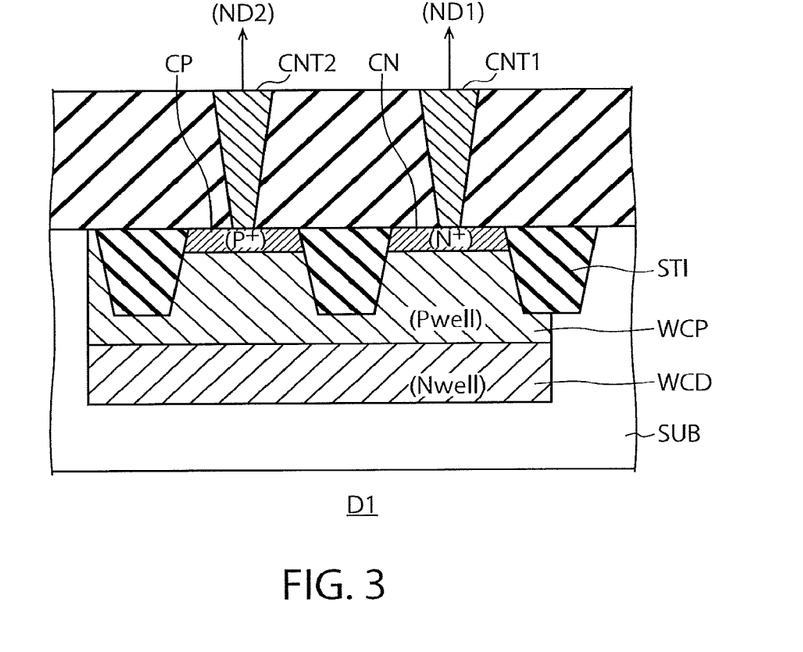
FIG. 3 is a cross-sectional view taken along a line 3-3 in FIG. 2B.

The configuration of the first diode D1 is described in more detail. FIG. 3 is a cross-sectional view taken along a line 3-3 in FIG. 2B. As illustrated in FIG. 3, the first diode D1 has a triple-well structure constituted of the substrate SUB, the N-well WCD, and the P-well WCP. The N-well WCD and the P-well WCP located below the first diode D1 have configurations that are substantially identical to those of the N-well WCD and the P-well WCP located below the memory cell array MCA, and can be formed by using a same mask in a common manufacturing process. Therefore, the concentration profiles in the depth direction of the N-well WCD and the P-well WCP located below the first diode D1 are substantially identical to those of the N-well WCD and the P-well WCP located below the memory cell array MCA.

In the present embodiment, the N-well WCD in the first diode D1 is in an electrically floating state between the substrate SUB and the P-well WCP.

Further, the first diode D1 includes the $N^+$-type electrode layer CN and a $P^+$-type electrode layer CP that are provided on the P-well WCP. The $P^+$-type electrode layer CP is constituted of a high-concentration P-type diffusion layer so as to electrically connect a contact plug CNT2 and the P-well WCP with low resistance. An element isolation layer STI (Shallow Trench Isolation) is provided between the $N^+$-type electrode layer CN and the $P^+$-type electrode layer CP. The element isolation layer STI electrically isolates the $N^+$-type electrode layer CN and the $P^+$-type electrode layer CP from each other.

The contact plug CNT2 is electrically connected as the anode of the first diode D1 to the node ND2 of FIG. 1. The contact plug CNT1 is electrically connected as the cathode of the first diode D1 to the node ND1 of FIG. 1. With this configuration, the P-well WCP and the electrode layer CN are connected as the first diode D1 between the nodes ND1 and ND2, thereby functioning to protect the internal circuit 90 from ESD.

The second diode D2 illustrated in FIG. 2C includes an N-well WND, a $P^+$-type electrode layer CP, and a contact plug CNT11. The second diode D2 has a double-well structure similarly to below the P-MOS transistor. The configuration of the N-well WND can be identical to configurations of those located below the P-MOS transistor.

The electrode layer CP as a second electrode layer is provided on the N-well WND as a third well in the surface region of the substrate SUB. The electrode layer CP is constituted of a high-concentration P-type diffusion layer so as to electrically connect to the contact plug CNT11 with low resistance. The contact plug CNT11 is electrically connected to the electrode layer CP. The electrode layer CP and the N-well WND constitute the second diode D2.

Figure 4:
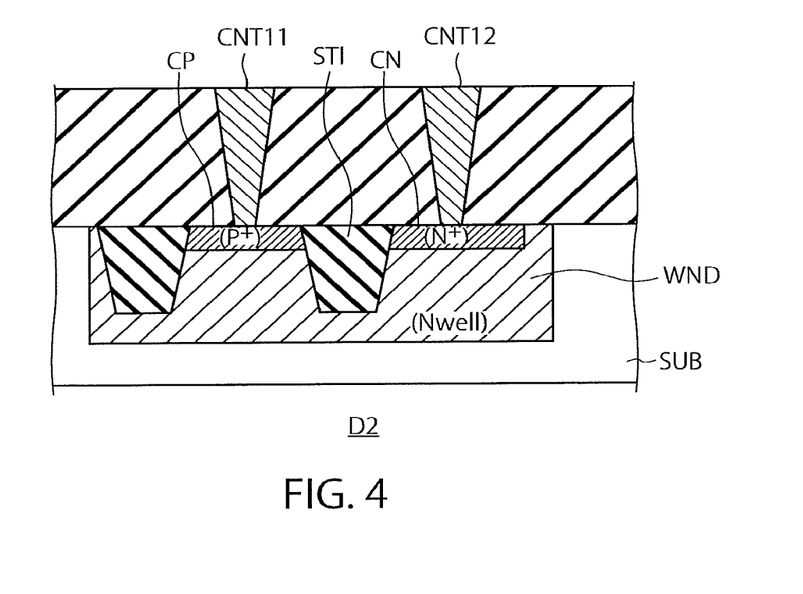
FIG. 4 is a cross-sectional view taken along a line 4-4 in FIG. 2C.

The configuration of the second diode D2 is described in more detail. FIG. 4 is a cross-sectional view taken along a line 4-4 in FIG. 2C. As illustrated in FIG. 4, the second diode D2 has a double-well structure constituted of the substrate SUB and the N-well WND. The N-well WND located below the second diode D2 has a configuration that is substantially identical to that of the N-well WND located below the P-MOS transistor of FIG. 2D, and can be formed by using a same mask in a common manufacturing process. Therefore, the concentration profile in the depth direction of the N-well WND located below the second diode D2 is substantially identical to that of the N-well WND located below the P-MOS transistor of FIG. 2D.

Further, the second diode D2 includes the $P^+$-type electrode layer CP and an $N^+$-type electrode layer CN that are provided on the N-well WND. The $N^+$-type electrode layer CN is constituted of a high-concentration N-type diffusion layer so as to electrically connect a contact plug CNT12 and the N-well WND with low resistance. An element isolation layer STI is provided between the $P^+$-type electrode layer CP and the $N^+$-type electrode layer CN. The element isolation layer STI electrically isolates the $N^+$-type electrode layer CN and the $P^+$-type electrode layer CP from each other.

The contact plug CNT11 is electrically connected as the anode of the second diode D2 to the node ND1 of FIG. 1. The contact plug CNT12 is electrically connected as the cathode of the second diode D2 to the node ND3. With this configuration, the N-well WND and the electrode layer CP are connected as the second diode D2 between the nodes ND1 and ND3, thereby functioning to protect the internal circuit 90 from ESD.

The P-MOS transistor of FIG. 2D includes an N-well WND and $P^+$-type electrode layers CP. The well structure below the P-MOS transistor is a double-well structure constituted of the substrate SUB and the N-well WND. The N-well WND as the third well is provided in a surface region of the substrate SUB that is different from the surface region where the N-well WCD is provided (that is, a forming region for a peripheral circuit to control the memory cell array MCA). Two electrode layers CP are provided on the N-well WND. One of the electrode layers CP functions as a source of the P-MOS transistor, and the other one of the electrode layers CP functions as a drain of the P-MOS transistor. The two electrode layers CP are connected to the contact plugs CNT3 and CNT4, respectively. The region of the N-well WND between the two electrode layers CP is a channel region CHp. Above the channel region CHp, a gate electrode Gp is provided via a gate dielectric film.

The N-MOS transistor of FIG. 2E includes a P-well WPD and $N^+$-type electrode layers CN. The well structure below the N-MOS transistor is a structure constituted of the substrate SUB and the P-well WPD. The P-well WPD as a third well is provided in a surface region of the substrate SUB that is different from the surface region where the P-well WCP is provided (that is, the forming region for the peripheral circuit to control the memory cell array MCA).

Two electrode layers CN are provided on the P-well WPD. One of the electrode layers CN functions as a source of the N-MOS transistor, and the other one of the electrode layers CN functions as a drain of the N-MOS transistor. The two electrode layers CN are connected to the contact plugs CNT5 and CNT6, respectively. The region of the P-well WPD between the two electrode layers CN is a channel region CHn. Above the channel region CHn, a gate electrode Gn is provided via a gate dielectric film.

In this manner, according to the present embodiment, the well structure below the first diode D1 of the first ESD protection diode 30 is substantially identical to the well structure below the memory cell array MCA. That is, in the present embodiment, the well structure below the first diode D1 of the first ESD protection diode 30 is made as a triple-well structure that is substantially identical to the well structure below the memory cell array MCA.

The impurity concentration of the P-well WCP is lower than the impurity concentration of the P-well WPD in which the N-MOS transistor is provided. The reason is that the impurity concentration of the P-well WPD is set higher than the impurity concentration of the P-well WCP so as to suppress punch through in the channel region CHn of the N-MOS transistor. Therefore, if the P-well WPD is provided below the first diode D1 to make the well structure as the double-well structure illustrated in FIG. 2E, the first diode D1 becomes a diode constituted of the P-well WPD and the electrode layer CN. Because the P-well WPD is higher in impurity concentration than the P-well WCP, when a high voltage due to ESD is applied to the node ND1 (the contact plug CNT1), a depletion layer extending in the P-well WPD becomes smaller than a depletion layer extending in the P-well WCP. Therefore, the first diode D1 constituted of the P-well WPD becomes larger in junction capacity (Cj) than the first diode D1 constituted of the P-well WCP. When the junction capacity (Cj) of the first diode D1 is large, it leads to leakage of a high-frequency signal when the high-frequency signal is transmitted to the node ND1 in normal operation, thereby degrading the function as a high speed interface. That is, when the well structure below the first diode D1 is made identical to the well structure below the N-MOS transistor (the double-well structure illustrated in FIG. 2E), it may degrade the high-frequency signal. Further, the impurity concentration of the P-well WPD influences the characteristics of the channel region CHn of the N-MOS transistor in the peripheral circuit. Therefore, it is difficult to make the impurity concentration of the P-well WPD low to make it suitable to the ESD protection circuit 1.

On the other hand, according to the present embodiment, the well structure below the first diode D1 of the first ESD protection diode 30 is substantially identical to the well structure below the memory cell array MCA (the triple-well structure illustrated in FIG. 2A). With this configuration, the first diode D1 becomes a diode constituted of the P-well WCP having a relatively low impurity concentration and the electrode layer CN, and the depletion layer extends largely. For example, the impurity concentration of the P-well WCP is lower by 0.5 order of magnitude than the impurity concentration of the P-well WPD. Therefore, the junction capacity (Cj) of the first diode D1 becomes small and does not disturb the high-frequency signal in normal operation, and the function as a high speed interface can be maintained. Further, because it is not necessary to change the impurity concentration of the P-well WPD, transistors of the peripheral circuit are not affected. In this manner, the ESD protection circuit 1 according to the present embodiment can allow a large current to flow while not affecting the characteristics of the internal circuit and suppressing degradation of the high speed interface.

According to the present embodiment, the well structure below the first diode D1 can be formed in a manufacturing process that is common to the well structure located below the memory cell array MCA. Accordingly, an increase in manufacturing cost can be suppressed without adding any manufacturing process for the ESD protection circuit 1.

Figure 5:
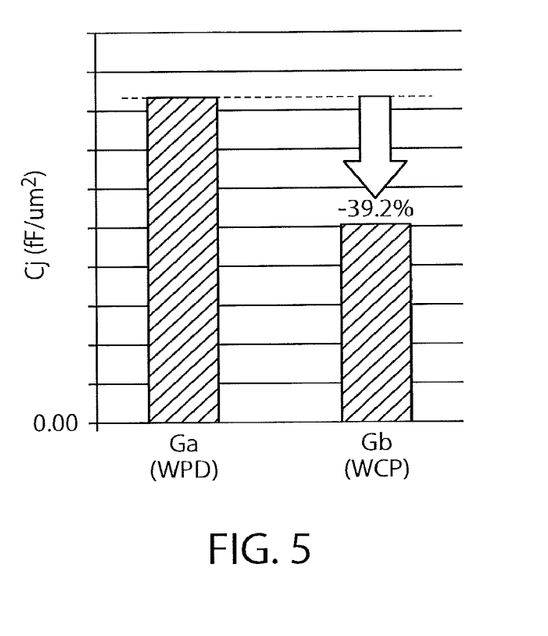
FIG. 5 is a graph illustrating junction capacities (Cj) of the first diodes.

FIG. 5 is a graph illustrating junction capacities (Cj) of the first diodes D1. A graph Ga is a graph representing a junction capacity (Cj) of the first diode D1 using the P-well WPD. A graph Gb is a graph representing a junction capacity (Cj) of the first diode D1 using the P-well WCP. It is found out that the junction capacity (Cj) of the first diode D1 using the P-well WCP is reduced by 39.2% from that of the first diode D1 using the P-well WPD. Therefore, the first diode D1 having the P-well WCP can maintain the function as a high speed interface even when a layout area is enlarged to increase current driving capability. That is, the ESD protection circuit 1 according to the present embodiment is suitable as an ESD protection circuit for a VLV transistor for a high speed interface.

For example, in order to protect a VLV transistor used for a high speed interface of 800 Mbps or higher against ESD, for example, it is necessary to change the corresponding circuit from an ESD protection circuit constituted of a GGMOS (Gate Ground MOS) to an ESD protection circuit constituted of an RCTMOS (RC Trigger MOS). When the ESD protection circuit 1 according to the present embodiment is constituted of an RCTMOS, a certain degree of current driving capability is necessary so as to protect the internal circuit from ESD such as HBM (Human Body Model), and it is necessary to enlarge layout areas of the first and second diodes D1 and D2. When the layout areas of the first and second diodes D1 and D2 are enlarged, their junction capacities (Cj) become large, and thus the characteristics of the high speed interface are degraded as described above. On the other hand, the ESD protection circuit 1 according to the present embodiment can reduce an increase in junction capacity (Cj) due to enlargement of the layout area of the first diode D1 by decreasing the junction capacity (Cj) of at least the first diode D1. In this manner, the ESD protection circuit 1 according to the present embodiment can assure sufficient current driving capability for protecting the internal circuit from ESD while suppressing degradation of the characteristics of a high speed interface.

Second Embodiment

Figure 6:
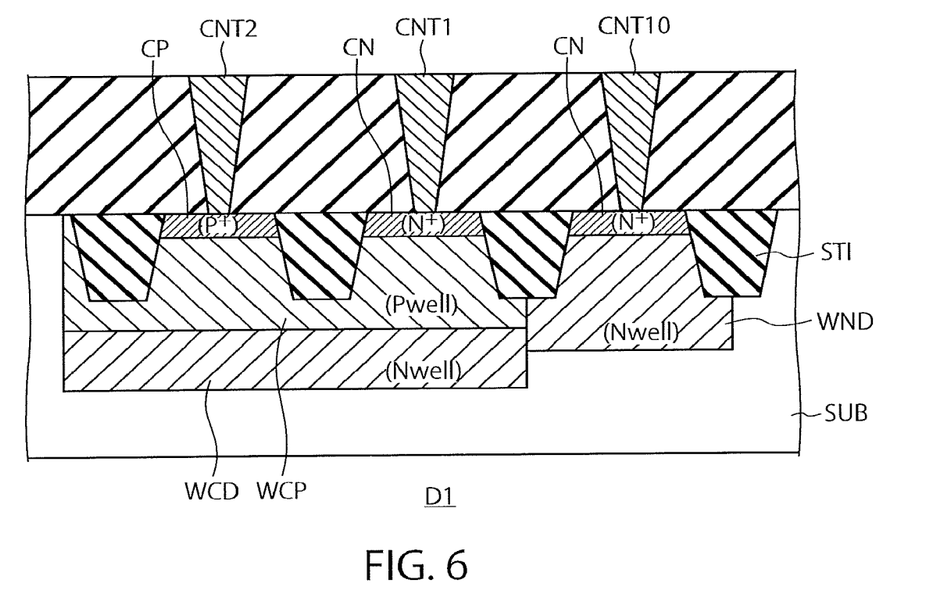
FIG. 6 is a cross-sectional view illustrating a configuration example of the first diode D1 according to a second embodiment.

FIG. 6 is a cross-sectional view illustrating a configuration example of the first diode D1 according to a second embodiment. The cross section in FIG. 6 corresponds to the cross section taken along the line 3-3 in FIG. 2B.

The first diode D1 according to the second embodiment further includes the N-well WND that is electrically connected to the N-well WCD. Other configurations of the ESD protection circuit 1 according to the second embodiment can be identical to the corresponding configurations of the ESD protection circuit 1 according to the first embodiment.

The N-well WND as a fourth well is provided to be adjacent to the P-well WCP and the N-well WCD. On the N-well WND, the N$^+$-type electrode layer CN is provided. The N$^+$-type electrode layer CN is constituted of a high-concentration N-type diffusion layer so as to electrically connect a contact plug CNT10 and the N-well WND with low resistance. On the N$^+$-type electrode layer CN, the contact plug CNT10 is provided. The contact plug CNT10 is electrically connected to the N-well WND via the N⁺-type electrode layer CN.

By applying a voltage to the N-well WND, a potential can be applied to the N-well WCD. In this manner, it is possible to solve the problems that occur when the N-well WCD is in an electrically floating state. The second embodiment can also obtain effects of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate of a first conducting type;
a pad provided on the semiconductor substrate;
an internal circuit provided on the semiconductor substrate; and
an electrostatic discharge protection element provided between the pad and the internal circuit, the electrostatic discharge protection element comprising
a first well of a second conducting type provided in a surface region of the semiconductor substrate,
a second well of a first conducting type provided inside the first well in the surface region of the semiconductor substrate,
a first electrode layer of a second conducting type provided inside the second well in the surface region of the semiconductor substrate,
a third electrode layer of the first conducting type provided inside the second well in the surface region of the semiconductor substrate, and
an element isolation layer provided between the first electrode layer and the third electrode layer and isolating the first electrode layer and the third electrode layer.

2. The device of claim 1, wherein the second well and the first electrode layer are included in a first diode configured to protect the internal circuit from electrostatic discharge.

3. The device of claim 1, further comprising a memory cell array provided above the first and second wells.

4. The device of claim 2, further comprising a memory cell array provided above the first and second wells.

5. The device of claim 3, wherein the first and second wells included in the electrostatic discharge protection element have configurations substantially identical to configurations of first and second wells located below the memory cell army.

6. The device of claim 5, wherein concentration profiles in a depth direction of the first and second wells included in the electrostatic discharge protection element are substantially identical to concentration profiles of the first and second wells located below the memory cell array.

7. The device of claim 1, wherein the first electrode layer is electrically connected to a node between the pad and the internal circuit.

8. The device of claim 1, wherein the second well is in an electrically floating state.

9. The device of claim 1, further comprising a fourth well electrically connected to the first well, wherein
a voltage is applied to the fourth well.

10. A semiconductor device comprising:
a semiconductor substrate of a first conducting type;
a pad provided on the semiconductor substrate;
an internal circuit provided on the semiconductor substrate; and
an electrostatic discharge protection element provided between the pad and the internal circuit, the electrostatic discharge protection element comprising
a first well of a second conducting type provided in a surface region of the semiconductor substrate,
a second well of a first conducting type provided inside the first well in the surface region of the semiconductor substrate,
a first electrode layer of a second conducting type provided inside the second well in the surface region of the semiconductor substrate,
a third well of a second conducting type provided in a surface region of the semiconductor substrate, a surface region of the third well being different from the surface region where the first well is provided; and
at least one transistor provided on the third well, wherein
an impurity concentration of the second well is lower than an impurity concentration of the third well.

11. The device of claim 10, wherein the second well and the first electrode layer are included in a first diode configured to protect the internal circuit from electrostatic discharge.

12. The device of claim 10, further comprising a memory cell array (MCA) provided above the first and second wells.

13. The device of claim 10, further comprising a second electrode layer of a first conducting type provided on the third well, wherein
the third well and the second electrode layer are included in a second diode configured to protect the internal circuit from electrostatic discharge.

14. The device of claim 13, wherein the second electrode layer is electrically connected to a node between the pad and the internal circuit.

15. The device of claim 10, wherein the second well is in an electrically floating state.

16. The device of claim 10, further comprising a fourth well electrically connected to the first well, wherein
a voltage is applied to the fourth well.

* * * * *